US005969568A

United States Patent [19]

Vester

[11] Patent Number: 5,969,568

[45] Date of Patent: Oct. 19, 1999

[54] POWER OUTPUT ELEMENT OF AN AMPLIFIER/TRANSMITTER

[75] Inventor: Markus Vester, Erlangen, Germany

[73] Assignee: Siemens Aktiengesellschaft, München, Germany

[21] Appl. No.: 08/989,522

[22] Filed: Dec. 12, 1997

[30] Foreign Application Priority Data

Dec. 18, 1996 [DE] Germany ............................ 196 52 854

[51] Int. Cl.[6] ................................ G06G 7/12; G06G 7/26

[52] U.S. Cl. ........................... 327/560; 327/562; 330/252

[58] Field of Search ..................................... 327/560, 561, 327/562, 563, 336, 337, 345; 330/252, 253, 260

[56] References Cited

U.S. PATENT DOCUMENTS 4,241,303 12/1980 Thompson ................................ 323/19
4,858,169 8/1989 Fields ...................................... 364/829
4,864,155 9/1989 Schmitz ................................. 307/112
4,961,184 10/1990 Owen ........................................ 370/76
5,117,193 5/1992 Yamaguchi ............................. 328/120
5,483,190 1/1996 McGivern ............................... 327/334

*Primary Examiner*—Timothy P. Callahan
*Assistant Examiner*—An T. Luu
*Attorney, Agent, or Firm*—Kenyon & Kenynon

[57] ABSTRACT

A circuit to be used in a power amplifier element to achieve triggered bias control of one or several individual transistors in the amplifier element in relation to their individual tolerances. A control circuit is provided for each transistor, each control circuit being controlled by a common controller and including an integration circuit for suitable balancing of the different individual threshold voltages of each transistor.

6 Claims, 5 Drawing Sheets

POWER OUTPUT ELEMENT OF AN AMPLIFIER/TRANSMITTER

FIELD OF THE INVENTION

The present invention relates to the power output element of an amplifier/transmitter and, more particularly, to the mutual balancing of a plurality of transistors connected in parallel in this power output element.

BACKGROUND INFORMATION

It is known that the power output elements of an amplifier/transmitter can be built using a plurality of transistors, for example, with more than 100 transistors, which act connected in parallel. It is important that the load on the individual transistors of this circuit be as uniform as possible so that no single transistor be overloaded. Due to the unavoidable manufacturing tolerances of the available transistors (of the same type) and, in particular, due to their different gate threshold voltages, which may vary from 2 V to 4 V, it is essential that proper balancing be provided. Even differences as small as 20 mV in the gate bias between transistors result in differences of approximately 20% in the respective bias currents. Since it is not feasible to select, with sufficient accuracy, so many transistors having the same threshold voltages, one solution is to individually adjust the operating point of each transistor. In principle, either pre-adjusted control elements or electronic regulating circuits can be used for this purpose. Manual balancing of a number of potentiometers is, however, extremely costly. While electronic actuators with ROMs and digital-analog converters make automatic adjustment possible, ultimately they also require an extremely high expenditure for the individual DA converters and their drivers.

Another problem arising with a circuit consisting of a plurality of transistors is the temperature-dependence of the threshold voltage of the respective transistors. Since the temperature coefficient is mostly negative, i.e., the current increases with increasing temperature, catastrophic increase in the power loss may occur as a result of this positive feedback.

Therefore, when the transistors of a power amplifier element are connected in parallel, current may become concentrated in one or a few of the transistors even in the case of small parameter differences and/or temperature changes, and even if the total current of said element is limited by other measures. Aging effects of the transistors proper or of their bias sources may also result in considerable current variations, even if such aging effects cause only little change in the threshold voltage or the bias.

In operating an amplifier element, in particular, a power output element of an amplifier, in particular, a transmitter, the minimum object and requirement consists of a linear reproduction of the amplitudes of the high-frequency signals to be amplified. It is known that such an amplifier element may be operated in Class A or B operation. The selection of one of the aforementioned operating modes depends, in particular, on whether small-signal or large-signal modulation is performed and what bias current is required or tolerated for these amplifier elements.

In the case of small modulation amplitudes, Class A operation is preferably used for both half-waves of the high-frequency signal in a suitably selected, preferably linear range of the characteristic curves. The bias current set determines the initial steepness. If this is selected to be one-half of the average large-signal steepness of a transistor, approximately the same gain is obtained for small and large signals with a so-called A-B Class operation. The absolute value and constancy over time of the bias current are critical for low distortion and high stability of the output signal.

A special application of an amplifier with a power output element is in a pulse transmitter. Such pulse transmitters are used, for example, in magnetic resonance tomography for generating radio frequency magnetic fields. The output pulses of such a transmitter have a transmission time lasting for one or a few ms, for example, with pauses between the pulses, which are the periods for reception of the response signals. In order to prevent interfering output noise of the transmitter from appearing in the transmission pauses/reception periods, it is customary to shut off the bias current of the transmitting element, which is referred to as blanking. This also contributes to a highly desirable reduction in the average DC power consumption of the transmitter power output element. Switching between transmission and pause, referred to as gating, takes place via an external control signal. The goal is to achieve a switchover delay that is as short as possible, e.g., less than 10 $\mu$s.

SUMMARY OF THE INVENTION

An object of the present invention is to provide a method for balancing, in a simple, but effective and reliable manner, the individual transistors of a plurality of transistors in a power output element.

The present invention uses the pauses in the operation of an amplifier element comprising a plurality of transistors to achieve objectives concerning the mutual balancing of the bias currents of the individual transistors and/or automatic adjustment of this balancing and/or, in particular, automatic balancing of the effects of temperature and the like on the stability of balancing.

The present invention comprises an automatically operating control circuit provided for each transistor, which sets the operating current/operating point of the respective transistor to a predefinable constant value independently of its individual threshold voltage and maintains it during the amplifier operation at this value. The control circuit of the present invention also helps achieve the important objectives presented in Class B operation of the amplifier element in other than small-signal operation (where such setting and maintaining of constant values can be achieved by other means at a relatively low cost). A continuously active current regulator for a class-B amplifier would have to be equipped with a variable setpoint following the variation of the current consumption of the amplifier with modulation. This setpoint adjustment, which should follow the amplitude modulation of the control, must take place rapidly, for example, in less than 1 $\mu$s. It must be taken into account that, in order to separate the bias from the high-frequency signal, low-pass filters are available which should compensate for short settling times. It must also be taken into account that a non-linear and frequency-dependent relationship between control and current consumption, as well as possible high-frequency interference in the control, result in considerable deterioration of the control characteristics.

To avoid the aforementioned disadvantages, the present invention provides for determining the threshold voltage of each transistor during the pause, using a closed-loop regulator to maintain a constant current during the pause. According to the present invention, the individual control circuit loops of the transistors are open while the amplifier element is in the active state, but the corresponding individual bias value of the transistor is maintained and effective as the gate threshold voltage while the amplifier element is on, at least until the next pause.

DETAILED DESCRIPTION

Figure 1:
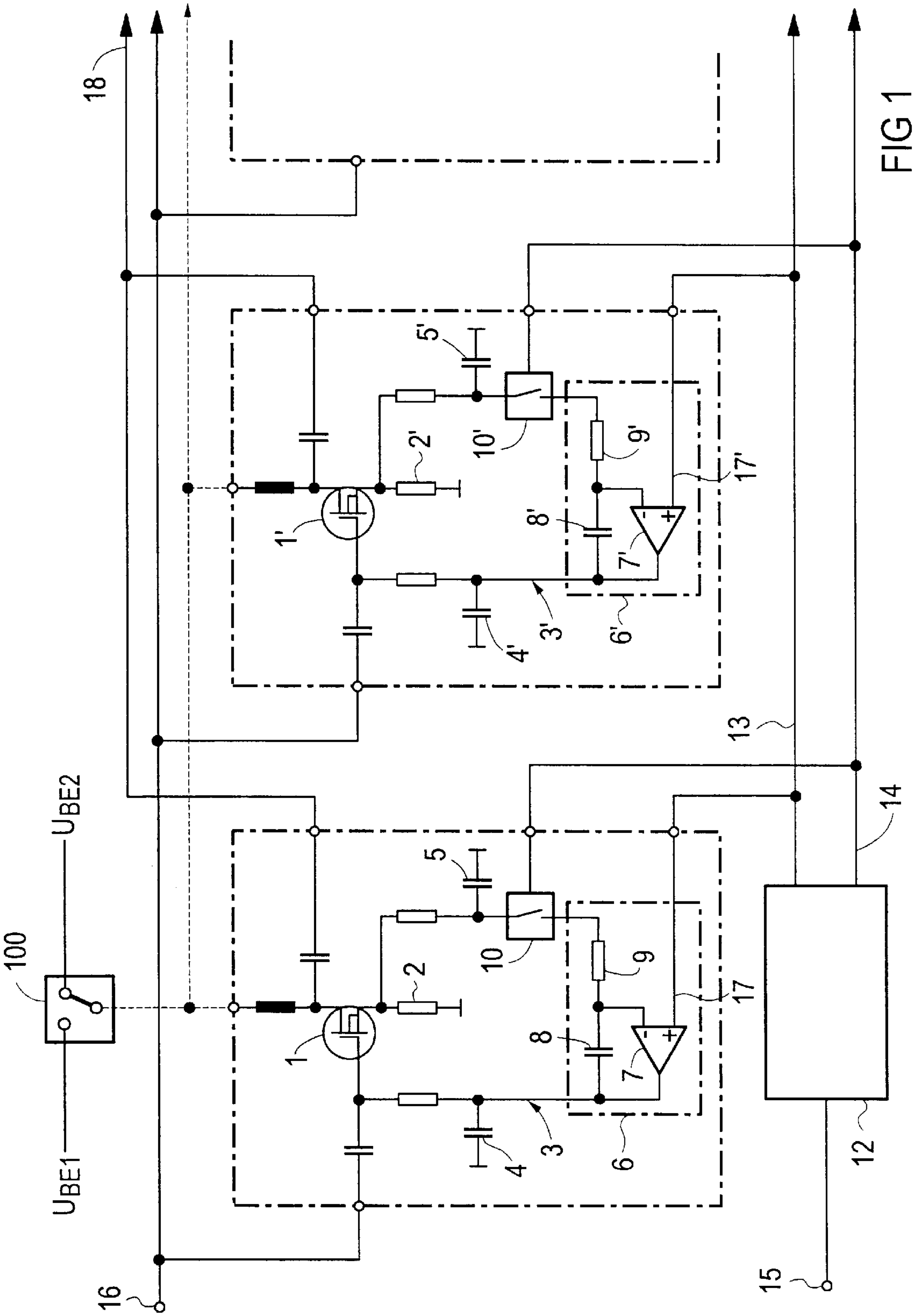
FIG. 1 shows a section of a multiple-transistor power amplifier element, specifically, the individual circuits for two transistors among a plurality of such transistors.
Figure 2:
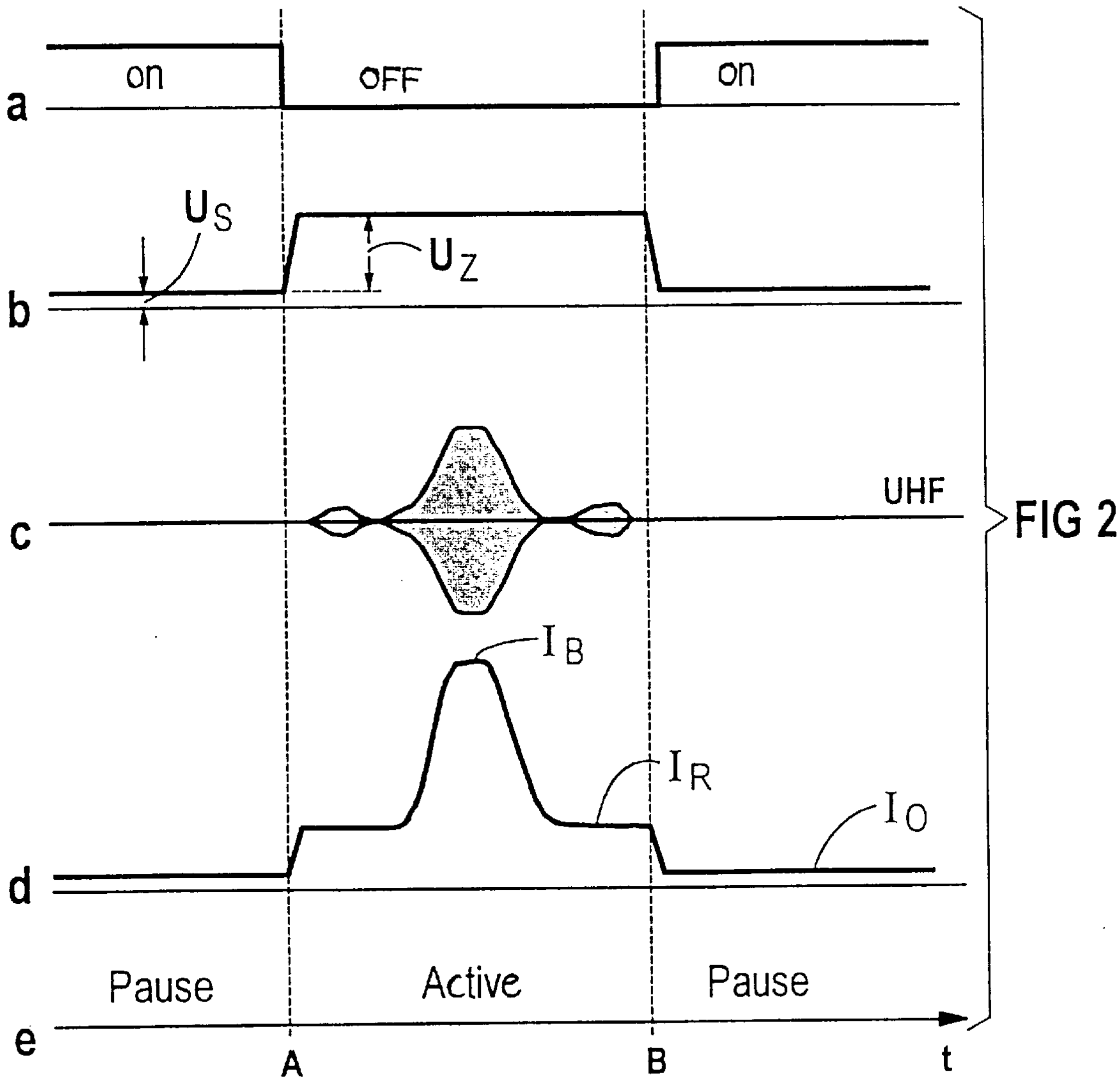
FIG. 2 shows a time diagram illustrating the operation of an individual circuit of FIG. 1.

Transistors 1 and 1' are contained in an amplifier element (comprising a plurality of such transistors), partially illustrated in FIG. 1. A relatively low-resistance measuring resistor 2, 2', . . . is connected to the source of each of the transistors 1, 1', . . . . Control circuit 3 of transistor 1 comprises bypass capacitors 4 and 5 to remove the high-frequency signals. An integrator circuit 6 comprises an operational amplifier (op-amp) 7, as well as an integration capacitor 8 and a series resistor 9. Triggerable (electronic) switch 10 keeps control circuit 3 open during transmission time/large-signal amplification and closed during transmission pauses. The corresponding circuit elements for the circuit of transistor 1' are denoted with a prime sign ('). The common control for switches 10, 10', . . . and control elements 6, 6', . . . and their supply leads are denoted as 13 and 14. The gating input is denoted by 15, while 16 denotes the common high-frequency signal input and 18 denotes the common high-frequency signal output of the entire amplifier element. The time diagram of FIG. 2 shows, in line a, the switching signal for switches 10, 10', . . . plotted against time. Line e shows the pauses and active time of the amplifier element. Line b shows setpoint selection $U_B$ of the gate voltage during the pauses and an additional voltage $U_Z$ (explained below), during the active phase. Line c shows an example of a high-frequency input signal to be amplified. Line d shows the drain supply current of the transistor plotted against time.

Figure 3:
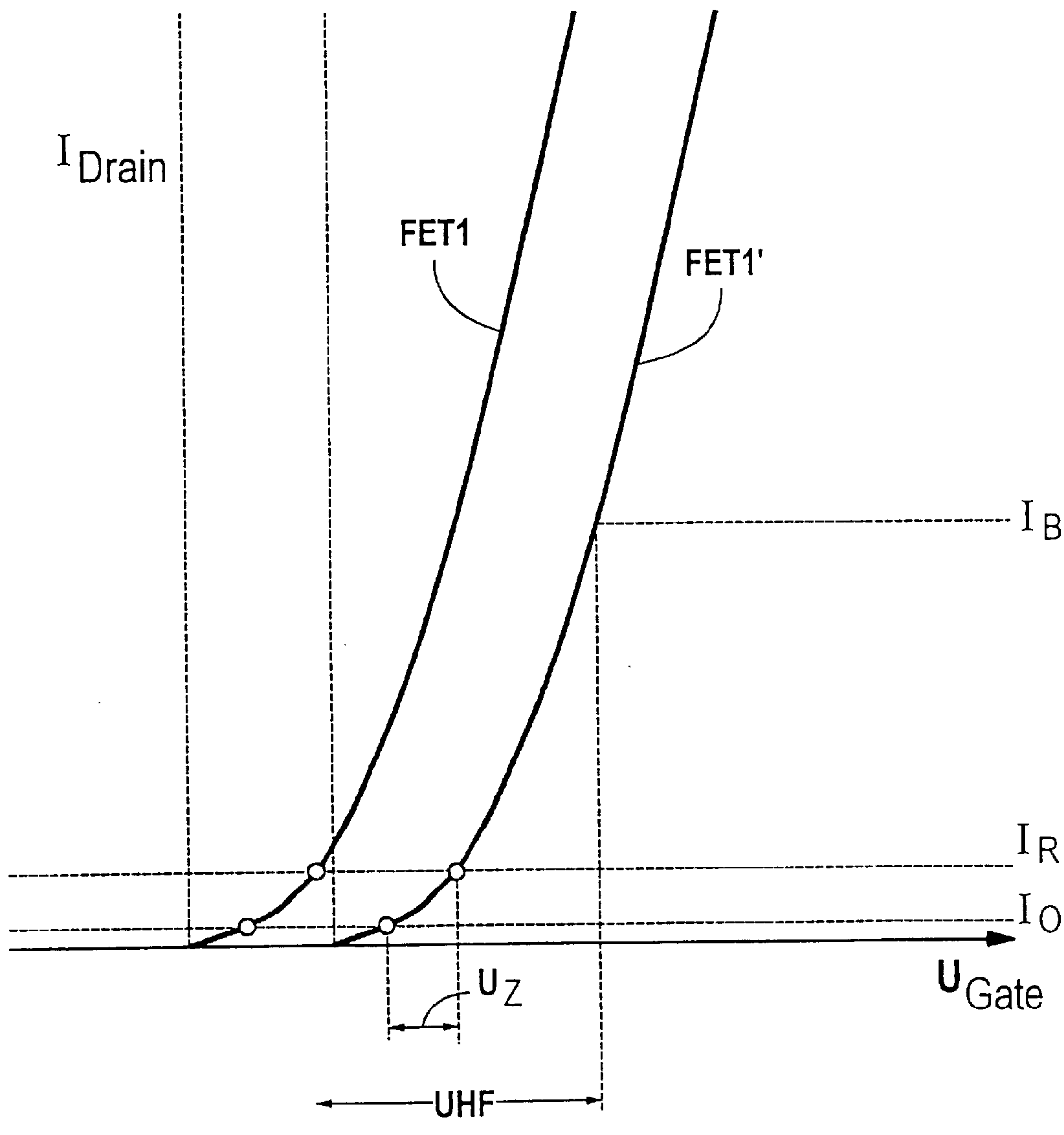
FIG. 3 shows the current/voltage relationships set or to be set in the field of characteristic curves.

As controlled by the Control circuits 3, 3', . . . , the switches 10, 10', . . . are closed during the amplification pauses (line e). By applying a voltage $U_B$ (e.g., 6 mV) valid for all transistors 1, 1', . . . to the common control 12, i.e., to conductor 13 leading to the individual+terminals 17 of the individual operational amplifiers 7, 7', . . . , a small measuring direct current will flow through each transistor 1, 1', . . . as a pause current $I_0$ (see FIG. 3), which is of the same intensity for all transistors 1, 1'. . . . Capacitors 8, 8',. . . are then charged to the gate voltage of each transistor 1, 1', . . . at which voltage a drain current of the same strength $I_0$ flows through those transistors. FIG. 3 shows, in the field of characteristic curves (for the two transistors FET1 and FET1'), the drain currents $I_0$, $I_R$ and $I_B$ flowing through all transistors, which, according to the present invention, are virtually of the same strength for the individual transistors at the different gate voltages set automatically and adapted to the manufacturing tolerances according to the present invention for the individual transistors (here 1 and 1'). $I_B$ represent a large-signal peak current, $I_R$ represents a bias current, and $I_0$ represents a pause current. At the beginning of the active phase (A in line e of FIG. 2), all switches 10, 10', . . . are opened together. The switch signal received by each switch 10, 10', . . . at that time is shown in FIG. 2, line a. Since no current can now flow through capacitors 8, 8', . . . , the different gate threshold voltages of the individual transistors are stored in said capacitors 8, 8', . . . according to the present invention. Thereupon, the voltage on lead 13, i.e., here on the positive input of operational amplifier 7, is increased by a fixed amount, valid for all transistors 1, 1', . . . (for example, 300 mV). FIG. 2, line b shows this voltage jump UZ, by which the voltage is increased at the output of integrator circuit 6, 6', . . . , and the gate of transistor 1, 1', . . . . This increase in the gate voltage results, according to the characteristic curve of the transistor, in increased direct current IR flowing through the respective transistor. This results in a current that increases in all transistors 1, 1', . . . by basically the same predefinable amount, since the differences in the threshold voltages of the transistors are basically given by a parallel shift of the characteristic curves. This increased gate bias voltage $U_S+U_Z$ remains at the gate of the transistor during the active phase of the amplifier element, and the current consumption $I_B$ can freely vary with the respective high-frequency modulation through the high-frequency input signal UHF (line c).

With the end of the active phase (B in line e), a pause follows again, during which control circuit 3 (switch 10) is closed again after a short delay (while the drain direct current decays; FIG. 2, line d). The setpoint inputs of control circuits 3 are set back to the voltage $U_S$ corresponding to pause current $I_0$, whereupon the drain direct current (line d) decays.

Any change caused by heating or aging due to a shift of the (individual) threshold voltage is eliminated through the pulsed control according to the present invention, because such changes are slow compared to the pulse frequency or pause sequence.

Figure 4:
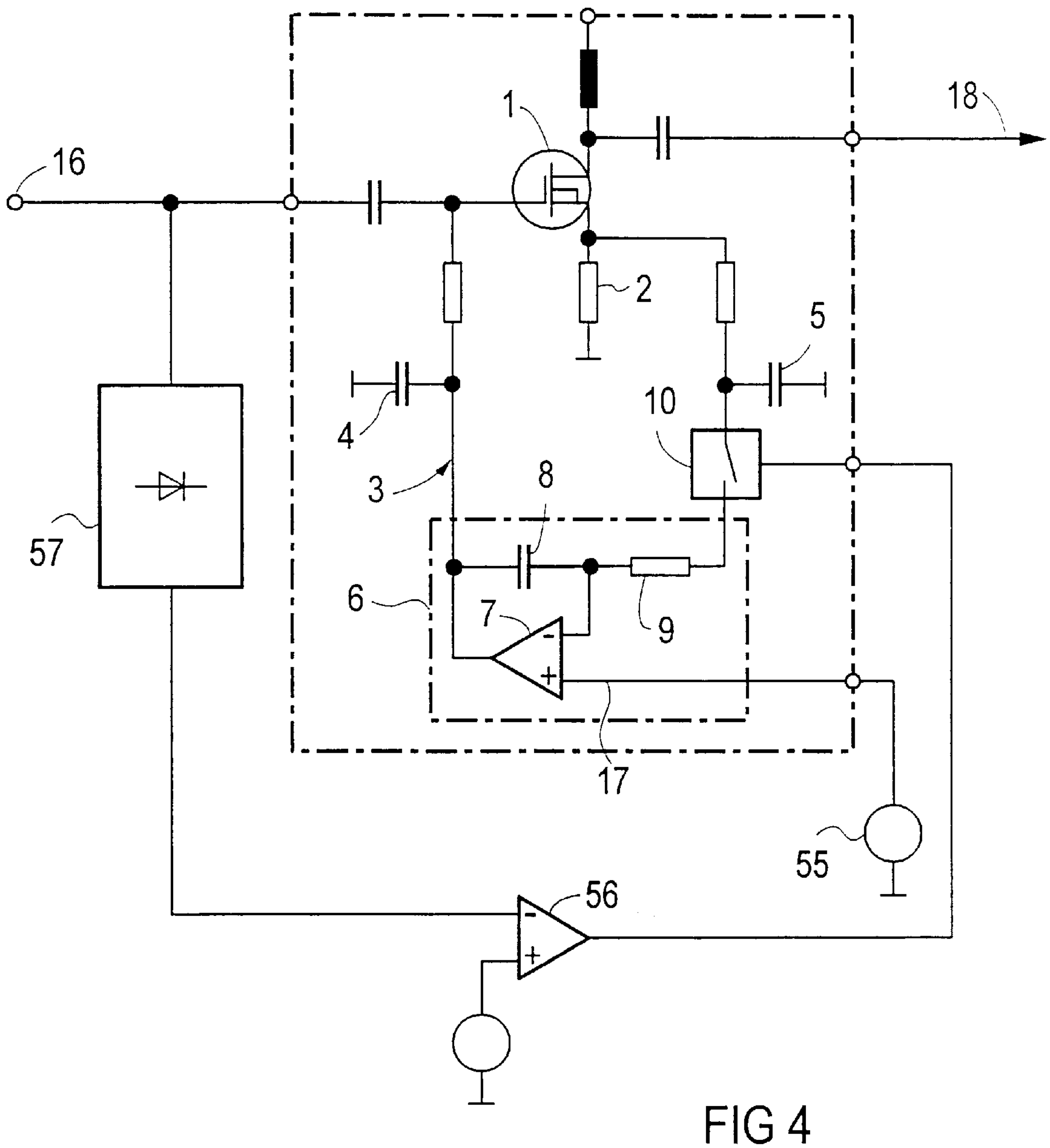
FIG. 4 shows a schematic of a control circuit that can be used in an alternative application, in accordance with the present invention.

The application of the present invention is, however, not limited to such amplifier elements that are (entirely) blanked in operation. The present invention can also be applied in cases where the amplifier element operates (at least) occasionally only/also in small-signal operation (instead of being switched as above to remain fully inactive). This application variant is particularly well-suited for cases where extremely low noise is not important. If periods, e.g., 100 $\mu$s, occur for example every 100 ms in amplitude-modulated signals, during which the signal amplitude to be amplified is small, these periods can be used to activate the control as described above for pauses and to set and adapt again the respective bias currents of the transistor among the plurality of transistors. The switchover criterion for actuating switches 10, 10', . . . can be derived, for example, from the envelope of the high-frequency signals to be amplified, namely, by making a comparison with a suitable threshold value. FIG. 4 shows a circuit that can be used in practice, where the details described in connection with FIG. 1 have the reference numbers used there. A source for a (constant) bias current setpoint is denoted with 55 and an operational amplifier with a source for determining the switchover threshold is denoted with 56. The output of rectifier 57, whose output signal provides the envelope value, is connected to the second input of operational amplifier 56.

Figure 5:
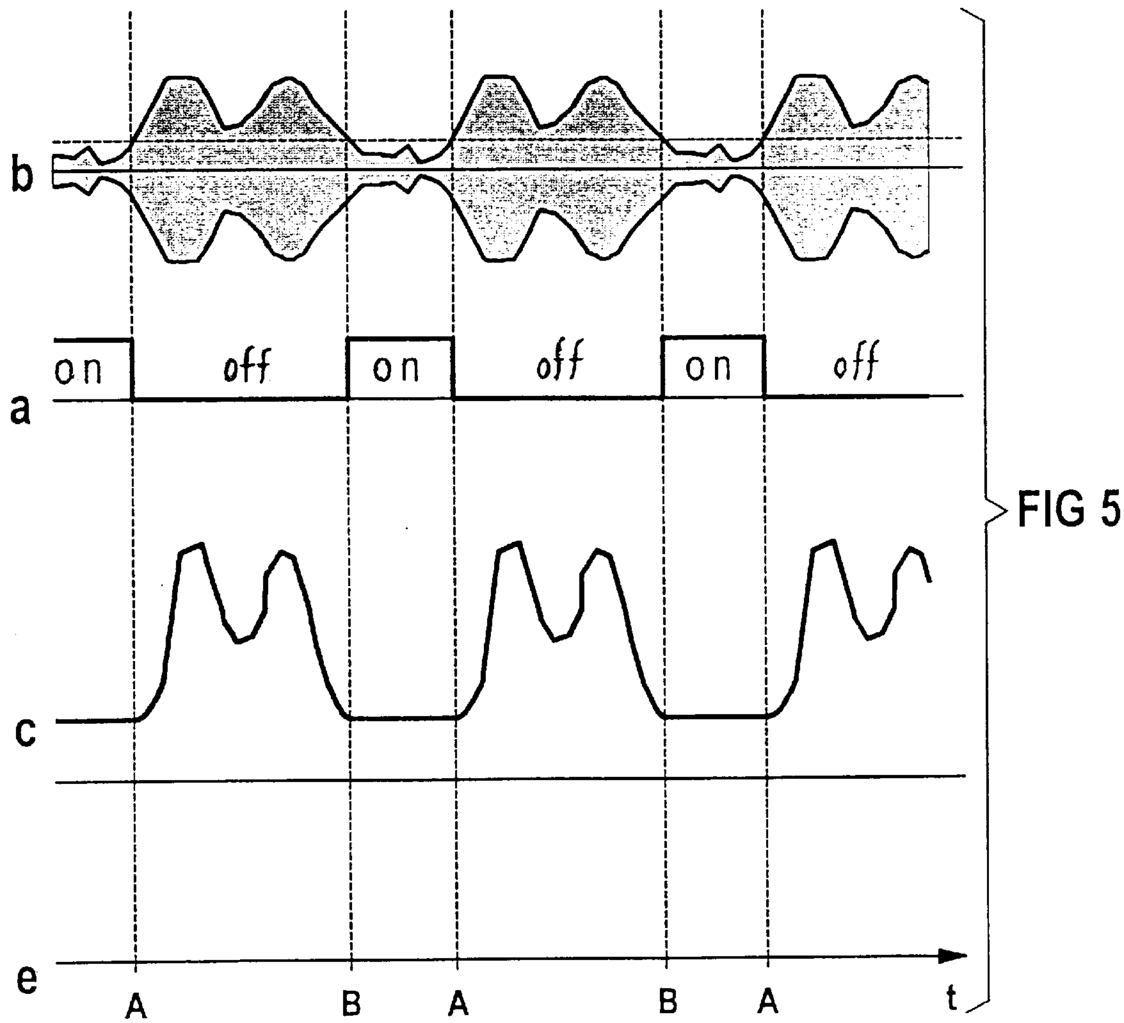
FIG. 5 shows a time diagram illustrating the operation of the circuit of FIG. 4.

FIG. 5 shows the time diagram corresponding to that of FIG. 2, with the switching signal in line a, a representative high-frequency signal with small-signal periods in line b, with a threshold value indicated by a dashed line, and the resulting drain direct current in line c.

For the application variant described above, it is only important that a changeover occur, in sufficiently short time intervals, between a phase with current regulation where only small-signal operation is present, and the phase where power amplification, i.e., large-signal amplification, occurs in which the bias voltages of transistors 1, 1', . . . are held constant according to the present invention.

Reduced noise and power savings can also be achieved by reducing the operating voltage $U_{BE}$ during the pauses, without unfavorably affecting the operation of the automatic individual adjustment of the gate voltages for the individual transistors 1, 1', . . . . FIG. 1 also shows switch-selectable terminals $U_{BE1}$ and $OU_{BE2}$ of an operating voltage ($U_{BE}$) Changeover switch 100 can be controlled together with switch 10. The amplifier receives the reduced operating voltage during the pauses. Outside the pauses the full operating voltage $U_{BE2}$ is applied.

To minimize the aforementioned adverse effects due to temperature changes or component aging, the present invention can also be advantageously applied to amplifiers having only a single transistor with a single bias control circuit.

What is claimed is:

1. A device having a plurality of transistors connected in parallel, the device comprising:

a controller, the controller generating a controllable potential and a switch control signal; and a plurality of control circuits, each of the plurality of control circuits being assigned to a corresponding one of the plurality of transistors and including:

an integrator circuit, the integrator circuit having an output which is coupled to a gate of the corresponding one of the plurality of transistors and a first input coupled to the controllable potential, and a switch, the switch being coupled between a second input of the integrator circuit and a source of the corresponding one of the plurality of transistors and having a control input which is coupled to the switch control signal.

2. The device of claim 1, wherein each of the plurality of transistors has an operating voltage, each operating voltage being controllably connected to different potentials through a changeover switch.

3. The device of claim 1, wherein the integrator circuit comprises an operational amplifier, a capacitor and a resistor, the capacitor being coupled between an output of the operational amplifier and an inverting input of the operational amplifier, and the resistor being coupled between the inverting input of the operational amplifier and the second input of the integrator circuit.

4. A device having one transistor, the device comprising:

a controller, the controller generating a controllable potential and a switch control signal; and a control circuit, the control circuit controlling the transistor and including:

an integrator circuit, the integrator circuit having an output which is coupled to a gate of the transistor and a first input coupled to the controllable potential, and a switch, the switch being coupled between a second input of the integrator circuit and a source of the transistor and having a control input which is coupled to the switch control signal.

5. The device of claim 4, wherein the transistor has an operating voltage, the operating voltage being controllably connected to different potentials through a changeover switch.

6. The device of claim 4, wherein the integrator circuit comprises an operational amplifier, a capacitor and a resistor, the capacitor being coupled between an output of the operational amplifier and an inverting input of the operational amplifier, and the resistor being coupled between the inverting input of the operational amplifier and the second input of the integrator circuit.

* * * * *